(12) United States Patent
Park (10) Patent No.: US 10,429,717 B2
(45) Date of Patent: Oct. 1, 2019

(54) BEAM STEERING DEVICE AND SYSTEM EMPLOYING SAME

(71) Applicant: SAMSUNG ELECTRONICS CO., LTD., Suwon-si (KR)

(72) Inventor: Jaechul Park, Yangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/805,794

(22) Filed: Nov. 7, 2017

(65) Prior Publication Data

US 2018/0136540 A1 May 17, 2018

(30) Foreign Application Priority Data

Nov. 11, 2016 (KR) .................. 10-2016-0150588

(51) Int. Cl.
| | | |
|---|---|---|
| *G02F 1/295* | (2006.01) | |
| *G02B 6/35* | (2006.01) | |
| *B81B 7/00* | (2006.01) | |
| *G02B 6/42* | (2006.01) | |

(52) U.S. Cl.
CPC ......... *G02F 1/2955* (2013.01); *G02B 6/3596* (2013.01); *B81B 7/0003* (2013.01); *G02B 6/4257* (2013.01)

(58) Field of Classification Search
None
See application file for complete search history.

(56) References Cited

U.S. PATENT DOCUMENTS

| | | | | |
|---|---|---|---|---|
| 4,909,584 A | * | 3/1990 | Imoto ............... | G02B 6/12007 385/15 |
| 6,141,127 A | * | 10/2000 | Boivin ................ | H04B 10/505 250/227.12 |
| 7,734,189 B2 | * | 6/2010 | Ranganath ......... | H04B 10/5053 359/254 |
| 9,104,086 B1 | | 8/2015 | Davids et al. | |
| 9,151,894 B2 | * | 10/2015 | Okano ................. | G02B 6/125 |
| 9,335,548 B1 | | 5/2016 | Cakmakci et al. | |
| 2006/0051103 A1 | * | 3/2006 | Ranganath .......... | H04B 10/506 398/183 |
| 2006/0274987 A1 | | 12/2006 | Mony et al. | |
| 2008/0219304 A1 | * | 9/2008 | Kupershmidt ....... | H01S 5/141 372/29.02 |
| 2012/0106890 A1 | * | 5/2012 | Gu ....................... | G02B 6/4214 385/14 |
| 2013/0064491 A1 | * | 3/2013 | Fujikata ............... | G02F 1/025 385/2 |
| 2013/0170781 A1 | * | 7/2013 | Kissa ................... | G02F 1/035 385/3 |
| 2013/0336611 A1 | * | 12/2013 | Lee ....................... | G02F 1/025 385/2 |
| 2015/0062691 A1 | | 3/2015 | Sayyah et al. | |
| 2015/0378241 A1 | | 12/2015 | Eldada | |
| 2018/0136540 A1 | * | 5/2018 | Park ..................... | G02B 6/3596 |

* cited by examiner

*Primary Examiner* — Tina M Wong (74) *Attorney, Agent, or Firm* — Sughrue Mion, PLLC (57) ABSTRACT

A beam steering device and a system employing the same are provided. The beam steering device includes: waveguides provided on a substrate to form channels through which light is transmitted; a modulators provided on the waveguides and configured to change, according to electrical signals, a phase of the light by changing a refractive index of the light which passes through the waveguides; and a driving circuit configured to provide the electrical signals to the modulators to drive the modulators.

20 Claims, 10 Drawing Sheets

BEAM STEERING DEVICE AND SYSTEM EMPLOYING SAME

CROSS-REFERENCE TO RELATED APPLICATION

This application claims priority from Korean Patent Application No. 10-2016-0150588, filed on Nov. 11, 2016 in the Korean Intellectual Property Office, the disclosure of which is incorporated herein in its entirety by reference.

BACKGROUND

1. Field

Methods and apparatuses consistent with exemplary embodiments disclosed herein relate to a beam steering device and a system employing the same.

2. Description of the Related Art

Beam steering methods to steer a beam to a desired location include a method of rotating a part of a device on which a beam is to be irradiated and an optical array (OPA) method.

A motor, micro-electromechanical system (MEMS) mirror, or the like is used to steer a beam to a desired location in the case of a beam steering method which includes rotating a part of a device on which a beam is to be irradiated. When a motor is used, the volume and price of a steering system increase and also noise may occur due to the motor. When a MEMS mirror is used, a narrow viewing angle is generated, and when high power light is emitted, a light-transmitting distance may be shortened due to stress applied to the MEMS mirror.

In the OPA method, a beam is steered based on a change in a phase of light emitted from a plurality of unit cells or a plurality of optical waveguides, the unit cells or the optical waveguides forming several channels for generating different phases. Thus, the beam may be steered into an intended direction by a combination of the phases output from the respective channels.

In a related art OPA method, a phase variation degree is adjusted by adjusting a length to be modulated of a modulation region of a channel. However, when a fault occurs in the modulation region, the fault cannot be repaired, and thus, beam steering performance may be lowered. In addition, since the length to be modulated is fixed, it may be necessary to compensate for a phase uniformity problem between channels.

SUMMARY

Exemplary embodiments disclosed herein may provide a beam steering device capable of preventing a decrease in beam steering performance due to a fault in a modulation region and a system employing the same.

According to an aspect of an exemplary embodiment, there is provided a beam steering device including: waveguides provided on a substrate to form channels through which light is transmitted; a modulators arranged along the waveguides and configured to change, according to electrical signals, a phase of the light by changing a refractive index of the light which passes through the waveguides; and a driving circuit configured to provide the electrical signals to the modulators to drive the modulators.

The driving circuit may include plural driving circuits, each driving circuit being one-to-one connected to a corresponding modulator among the modulators so as to independently drive the corresponding modulator.

The driving circuits may be complementary metal oxide semiconductor (CMOS) circuits.

The modulators may be spaced apart from each other on each of the waveguides.

Each of the modulators may include: a carrier modulation region in which a carrier density varies with the electrical signals such that a change in a refractive index of light passing through the carrier modulation region changes a phase of the light; a first doping region electrically connected to one side of the carrier modulation region and doped to have a predetermined density and be of a first conductive type; and a second doping region electrically connected to another side of the carrier modulation region opposite the one side and doped to have the predetermined density and be of a second conductive type opposite the first conductive type.

The carrier modulation region may surround a portion of a corresponding waveguide among the waveguides.

A refractive index of the carrier modulation region may be lower than a refractive index of the corresponding waveguide.

The beam steering device may further include a cladding layer which covers the carrier modulation region, and a portion of the corresponding waveguide may not be surrounded by the carrier modulation region.

The carrier modulation region may act as the waveguide.

The beam steering device may further include a cladding layer having a refractive index which is lower than a refractive index of the carrier modulation region and surrounding the carrier modulation region.

The waveguide may include silicon; or the carrier modulation region may be an n-type or p-type oxide semiconductor doped to have a density lower than the predetermined density of the first and second doping regions, one of the first and second doping regions may be a p-type oxide semiconductor, and the other one of the first and second doping regions may be an n-type oxide semiconductor.

The carrier modulation region may be an n-type or p-type oxide semiconductor in which a doping density is about $10^{17}$ or less, one of the first and second doping regions may be a p-type oxide semiconductor with a doping density of about $10^{19}$ or greater, and the other one of the first and second doping regions may be an n-type oxide semiconductor with a doping density of about $10^{19}$ or greater.

An outer periphery of a cross-section of the carrier modulation region may have an approximately rib shape or an approximately quadrangular shape.

Each of the modulators may form a p-type intrinsic n-type (PIN) diode or a metal oxide semiconductor (MOS) structure.

The driving circuit may include: a driver configured to drive the modulators; and a selector configured to perform a selection such that an input voltage is applied to the driver, to thereby apply a driving voltage to the modulators through the driver.

The waveguides and modulators may form a cells, and the driving circuit may further include a data storage configured to sequentially store data corresponding to the cells and the driving circuit may be configured to turn the selector on such that all the cells of the beam steering device are simultaneously turned on according to the stored data.

The driver may include a driving transistor including a source end and a drain end, the modulator may be electrically connected to the source end of the driving transistor, and the drain end of the driving transistor may include a resistor.

The driver may include a driving transistor including a source end and a drain end, and the modulator may be electrically connected to the drain end of the driving transistor.

The driving circuit may further include at least one of a voltage holder configured to hold an applied voltage for a predetermined time and a feedback unit configured to perform a feedback so as to compensate for a performance decrease of the modulators.

According to an aspect of another exemplary embodiment, there is provided a system including: a light source configured to emit a beam; a beam steering device configured to steer the beam emitted by the light source towards an object; and a detector configured to detect the steered beam reflected from the object, wherein the beam steering device includes: waveguides provided on a substrate to form channels through which the beam is transmitted; modulators arranged along the waveguides and configured to change, according to electrical signals, a phase of the beam by changing a refractive index of the beam which passes through the waveguides; and a driving circuit configured to provide the electrical signals to the modulators to drive the modulators.

Additional aspects will be set forth in part in the description which follows and, in part, will be apparent from the description, or may be learned by practice of the presented exemplary embodiments.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects.

Hereinafter, a beam steering device and a system employing the same, according to exemplary embodiments, will be described in detail with reference to the accompanying drawings. Like reference numerals in the drawings refer to like elements, and the sizes or thicknesses of components may be exaggerated for convenience of description. The exemplary embodiments described below are only illustrative, and various modifications can be made from these exemplary embodiments. In the specification, when it is described that one layer or substrate is provided "on", "on an upper part of", or "above" another layer or a substrate, the layer or substrate may be provided on another layer or the substrate directly or via another layer in the middle.

As used herein, expressions such as "at least one of," when preceding a list of elements, modify the entire list of elements and do not modify the individual elements of the list.

Figure 1:
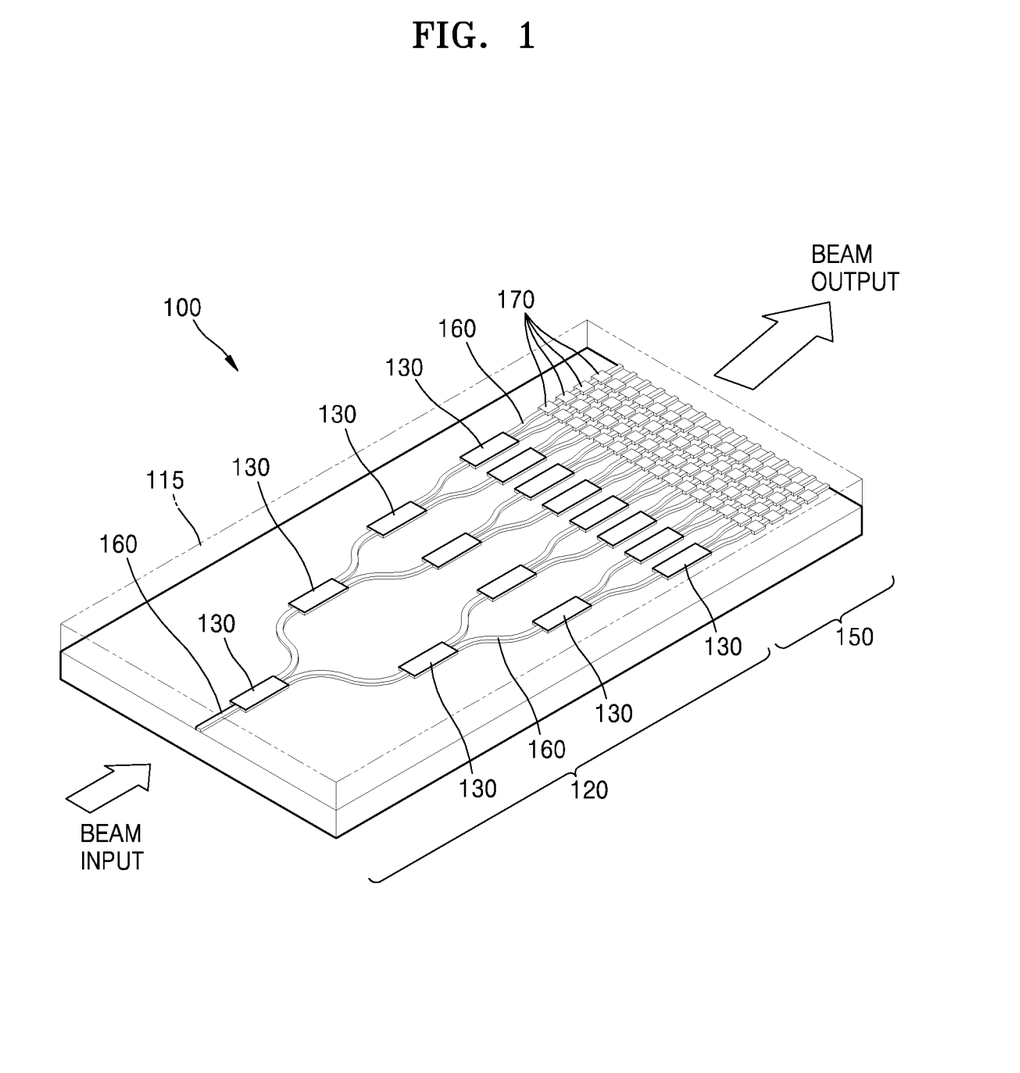
FIG. 1 is a perspective view illustrating a schematic configuration of a beam steering device according to an exemplary embodiment.
Figure 2:
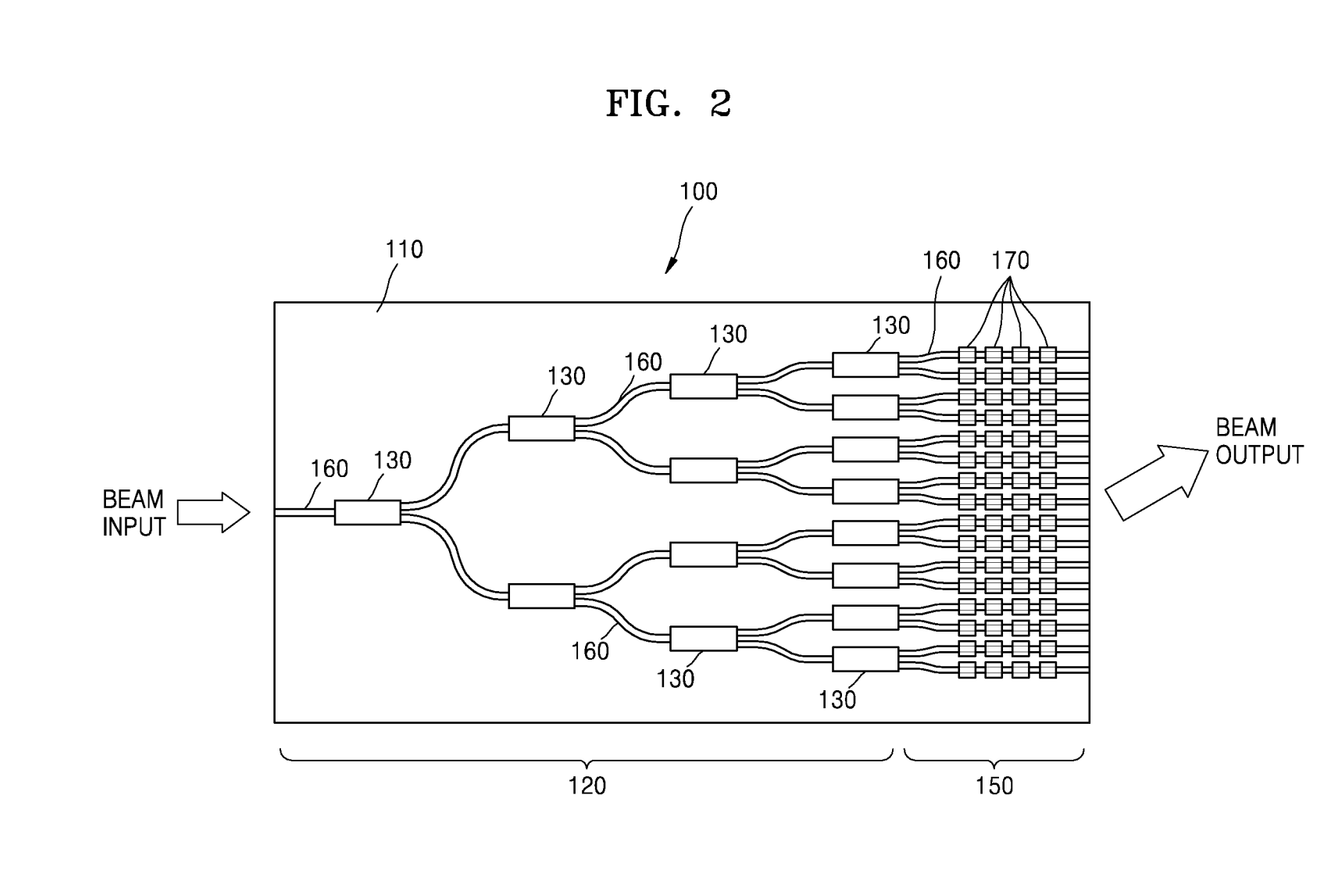
FIG. 2 is a schematic top view of the beam steering device of FIG. 1 according to an exemplary embodiment.
Figure 3:
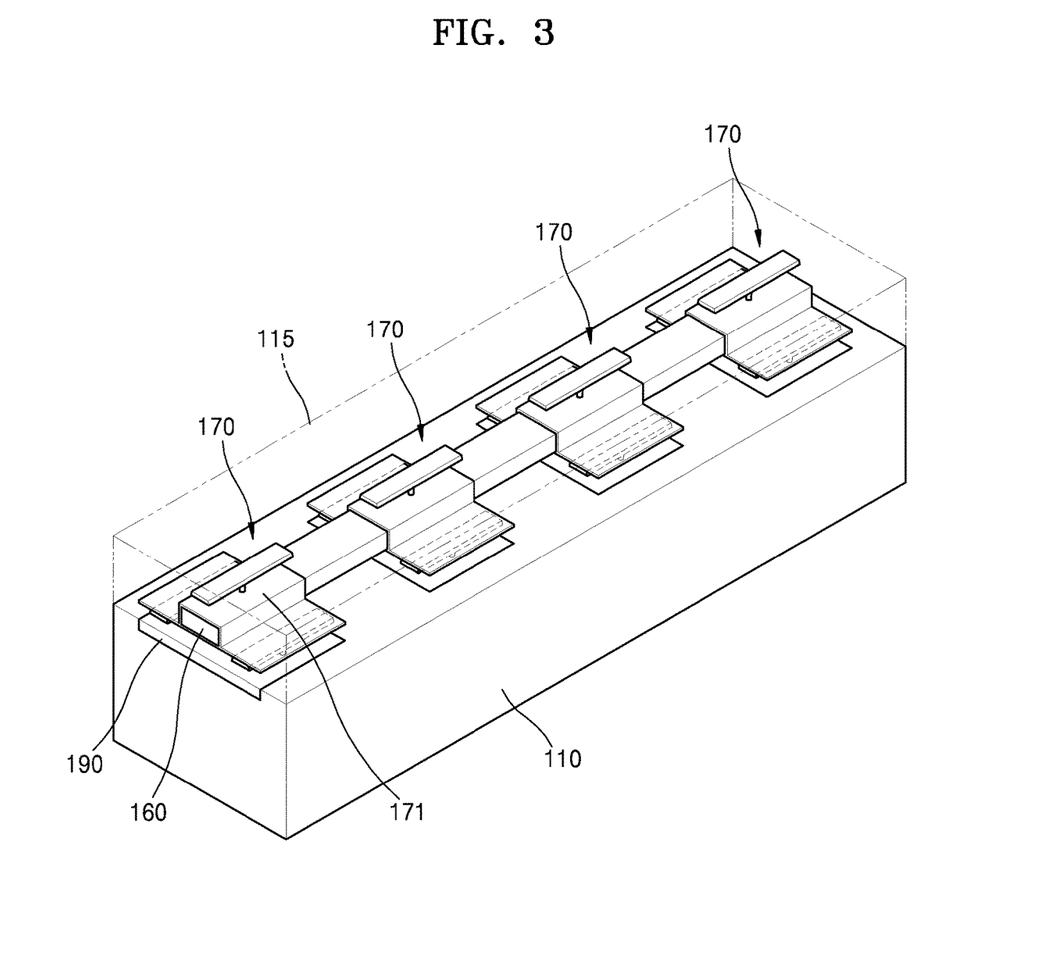
FIG. 3 is a perspective view illustrating a channel on which a plurality of modulators of FIG. 1 are arranged according to an exemplary embodiment.
Figure 4:
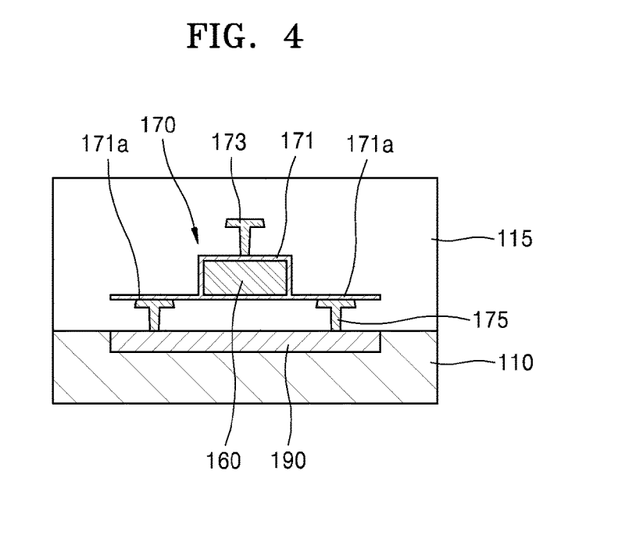
FIG. 4 is a cross-sectional view of the channel of FIG. 3 according to an exemplary embodiment.

FIG. 1 is a perspective view illustrating a schematic configuration of a beam steering device 100 according to an exemplary embodiment. FIG. 2 is a schematic top view of the beam steering device 100 of FIG. 1. FIG. 3 is a perspective view illustrating a channel on which a plurality of modulators 170 of FIG. 1 are arranged. FIG. 4 is a cross-sectional view of the channel of FIG. 3.

Referring to FIGS. 1 through 4, the beam steering device 100 may include a plurality of waveguides 160 arranged on a substrate 110 to form channels 150 through which a beam of light is transmitted, arrays of a plurality of modulators 170, and a driving circuit 190 configured to drive the plurality of modulators 170.

The substrate 110 may be, for example, a silicon substrate. When the substrate 110 is, for example, a silicon substrate, an insulator layer, e.g., a silicon oxide layer, is formed on the silicon substrate, and an optical configuration and circuit configurations forming the beam steering device 100 may be provided on the insulator layer. The substrate 110 may include various materials besides the silicon substrate.

Waveguides 160 may be arranged on the substrate 110. The waveguides 160 may include silicon. The waveguides 160 may include various other materials besides silicon.

A beam input to a waveguide 160 may be split to a plurality of waveguides 160 by a beam splitter 130. FIGS. 1 and 2 illustrate a case in which a beam is successively split to 16 channels by an arrangement of 15 beam splitters 130, each beam splitter 130 being configured to split an input beam to two waveguides 160.

At least one beam splitter 130 and the waveguides 160 that input a beam or beams to the least one beam splitter 130 form a beam distributor 120, and the waveguides 160 located at a terminal end of the beam distributor 120 may correspond to channels 150.

For example, as shown in FIGS. 1 and 2, when a beam input by a waveguide 160 is successively split by the 15 the arrangement of beam splitters 130 and finally transmitted to 16 waveguides 160 130, 16 channels 150 may be formed. According to various exemplary embodiments, a number of beam splitters 130, a number of beam splits by each beam splitter 130, a number of waveguides 160, and a number of channels 150 to be formed may be variously modified.

As described above with regard to the beam steering device 100 according to an exemplary embodiment, the number of channels 150 may correspond to the number of waveguides 160 located at the terminal end of the beam distributor 120.

A plurality of modulators 170 may be arranged along each of the 16 waveguides 160 forming the channel 150. The plurality of modulators 170 may change a refractive index of light, which passes through the waveguide 160 forming the channel 150, according to an electrical signal, thereby causing a change of a phase of light.

The plurality of modulators 170 may be change a refractive index of light by various methods such as thermo-optic, electro-optic, strain-optic, and phase change-optic methods and to cause a change of a phase of the light due to the change in the refractive index.

For example, each modulator 170 may include a carrier modulation region 171, a first doping region 173 of a first conductive type, which is electrically connected to one side of the carrier modulation region 171, and a second doping region 175 of a second conductive type opposite to the first conductive type, which is electrically connected to the other side of the carrier modulation region 171. The modulator 170 may change a phase of light by, for example, the electro-optic method.

The carrier modulation region 171 is a region in which a carrier density varies with an electrical signal such that a refractive index of light passing through the carrier modulation region 171 is changed to change a phase. The first doping region 173 may be doped to have a high density and be of a first conductive type. The second doping region 175 may be doped to have a high density and be of a second conductive type opposite the first conductive type. In this case, the carrier modulation region 171 may be doped to be of the first or second conductive type and to have a relatively lower density than those of the first and second doping regions 173 and 175. For example, the first doping region 173 may be doped to be of a high-density $n^+$ type, the second doping region 175 may be doped to be of a high-density $p^+$ type, and the carrier modulation region 171 may be doped to be of a low-density n or p type.

The carrier modulation region 171 may be an n- or p-type oxide semiconductor doped to have a relatively lower density than those of the first and second doping regions 173 and 175, one of the first and second doping regions 173 and 175 may be a p-type oxide semiconductor, and the other one thereof may be an n-type oxide semiconductor.

For example, the carrier modulation region 171 may include an oxide semiconductor, e.g., an n-type or p-type oxide semiconductor with a doping density of about $10^{17}$ or less. The carrier modulation region 171 may include a transparent conductive oxide (TCO) which is a material having a relatively high change in a refractive index due to application of an electrical signal. Herein, the TCO may include at least one of, for example, indium tin oxide (ITO), indium zinc oxide (IZO), gallium indium zinc oxide (GIZO), aluminum zinc oxide (AZO), gallium zinc oxide (GZO), and zinc oxide (ZnO).

One of the first and second doping regions 173 and 175 may be a p-type oxide semiconductor with a doping density of about $10^{19}$ or more, and the other one thereof may be an n-type oxide semiconductor with a doping density of about $10^{19}$ or more.

As described above, each modulator 170 including the carrier modulation region 171, and the first doping region 173 of the first conductive type and the second doping region 175 of the second conductive type, which are electrically connected to the one side and the other side of the carrier modulation region 171, respectively, may form a PIN diode structure or a MOS structure.

Referring to FIG. 4, the carrier modulation region 171 may be formed so as to surround a partial length of the waveguide 160 forming the channel 150. In this case, the carrier modulation region 171 may have a lower refractive index than the waveguide 160.

For example, the waveguide 160 may include silicon, and the carrier modulation region 171 may include an n- or p-type oxide semiconductor.

In the modulator 170, when an electrical signal is applied to the carrier modulation region 171 through the driving circuit 190, a charge density (carrier density) inside the carrier modulation region 171 varies in, for example, an interface between the carrier modulation region 171 and the waveguide 160, and a refractive index of the carrier modulation region 171 varies according to the change in the charge density. As such, when the refractive index of the carrier modulation region 171 varies, a phase of a beam passing through an adjacent waveguide 160 may be modulated due to evanescent wave interference.

Herein, when the carrier modulation region 171 acts as a waveguide as described in an exemplary embodiment below, a phase change due to only a change in the refractive index of the carrier modulation region 171 may be exemplarily described.

As shown in FIG. 4, the carrier modulation region 171 may be formed such that a shape of an outer periphery of a cross-section is approximately a rib shape. As another example according to an exemplary embodiment, the carrier modulation region 171 may be formed such that the shape of the outer periphery of the cross-section is approximately a quadrangular shape.

The beam steering device 100 may further include a cladding layer 115 to cover the carrier modulation region 171 and a waveguide portion which is not surrounded by the carrier modulation region 171. In this case, the cladding layer 115 may have a refractive index less than those of the carrier modulation region 171 and the waveguide 160. For example, the cladding layer 115 may be an insulator layer. In FIGS. 1 and 2, the cladding layer 115, e.g., the insulator layer, is formed to cover not only a region of the channels 150 but also a region of the beam distributor 120. However, this is only illustrative and the cladding layer 115 may be continuously or discontinuously formed so as to cover the carrier modulation region 171, the waveguides 160, and the like only in the region of the channels 150.

The plurality of modulators 170 arranged on each waveguide 160 forming the channel 150 may be arranged such that, when a maximum phase change amount obtainable by one modulator 170 is m, the number of modulators 170 arranged on each waveguide 160 is N, and a maximum phase change amount desired from each channel 150 for beam steering is Pmax, wherein m*N>Pmax is satisfied. That is, a spare number of modulators 170 exceeding the number of modulators 170 by which the maximum phase change amount desired from each channel 150 for beam steering is obtainable may be further arranged on each waveguide 160 forming a channel 150.

For example, when L modulators 170 are desired for each channel for beam steering, the beam steering device 100 may include M (satisfying M>L) modulators 170 arranged along the waveguide 160 forming each channel 150, and during beam steering, L or less modulators 170 may be used for the waveguide 160 forming each channel 150.

As described above, when a desired number of or more of the modulators 170 are arranged along each waveguide 160 forming the channel 150, even when a fault occurs in some of the modulators 170, a desired phase change amount may be obtained by using normally operating modulators 170 except for the modulators 170 in which a fault has occurred, and thus a quality decrease in a steered beam may be prevented.

In addition, since the number of the modulators 170 used during beam steering from among the modulators 170 arranged along each waveguide 160 is a maximum L, when the number of the waveguides 160 forming the channels 150 is H, the beam steering device 100 according to an exemplary embodiment steers a beam by driving two-dimensionally arranged H*L phase change cells. Each modulator 170 may correspond to a phase change cell of the beam steering device 100. In addition, a plurality of phase change cells for each channel 150 may exist by being spaced apart from each other.

The driving circuit 190 drives one or a plurality of modulators 170. The driving circuit 190 may include a plurality of driving circuits 190 one-to-one connected to the plurality of modulators 170, respectively, so as to independently drive each of the plurality of modulators 170 prepared for each channel 150. The driving circuit 190 may be, for example, a complementary metal oxide semiconductor (CMOS) circuit. Although FIGS. 1 through 4 shows an example in which the driving circuit 190 is disposed on the substrate 110 so as to be located below the waveguide 160 and the modulator 170, the present exemplary embodiment is not limited thereto. For example, the driving circuit 190 may be disposed on the substrate 110 so as to be located between the waveguides 160 or may be prepared so as to be located on the cladding layer (insulator layer) 115.

According to the beam steering device 100 according to an exemplary embodiment, by configuring the driving circuit 190 to independently drive each of the plurality of modulators 170, as described above, even when a fault occurs in some of the modulators 170, a desired phase change amount may be obtained by operating only the normally operating modulators 170, and thus, a quality decrease of a steered beam may be prevented.

Figure 5:
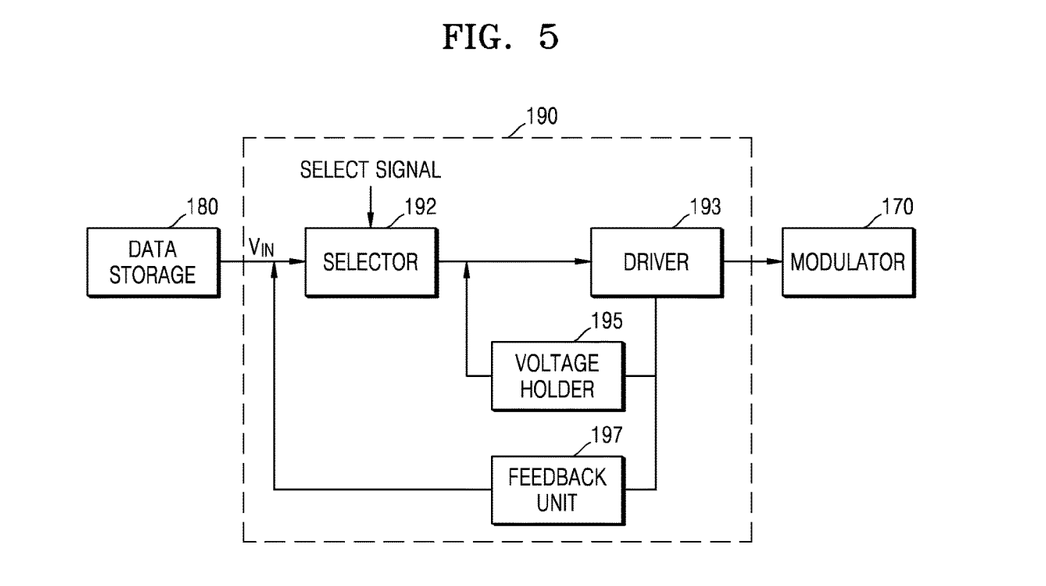
FIG. 5 is a schematic block diagram of an example of a driving circuit applied to the beam steering device, according to an exemplary embodiment.

FIG. 5 is a schematic block diagram of an example of the driving circuit 190 applied to the beam steering device 100, according to an exemplary embodiment.

Referring to FIG. 5, the driving circuit 190 may include a driver 193 configured to drive a corresponding modulator 170 and a selector 192 configured to perform a selection such that an input voltage is applied to the driver 193, and thus a driving voltage is applied to the modulator 170 through the driver 193. The driving circuit 190 may further include a voltage holder 195 configured to hold an applied voltage for a predetermined time. In addition, the driving circuit 190 may further include a feedback unit 197 configured to perform a feedback so as to supplement a performance decrease of the modulator 170.

Figure 6:
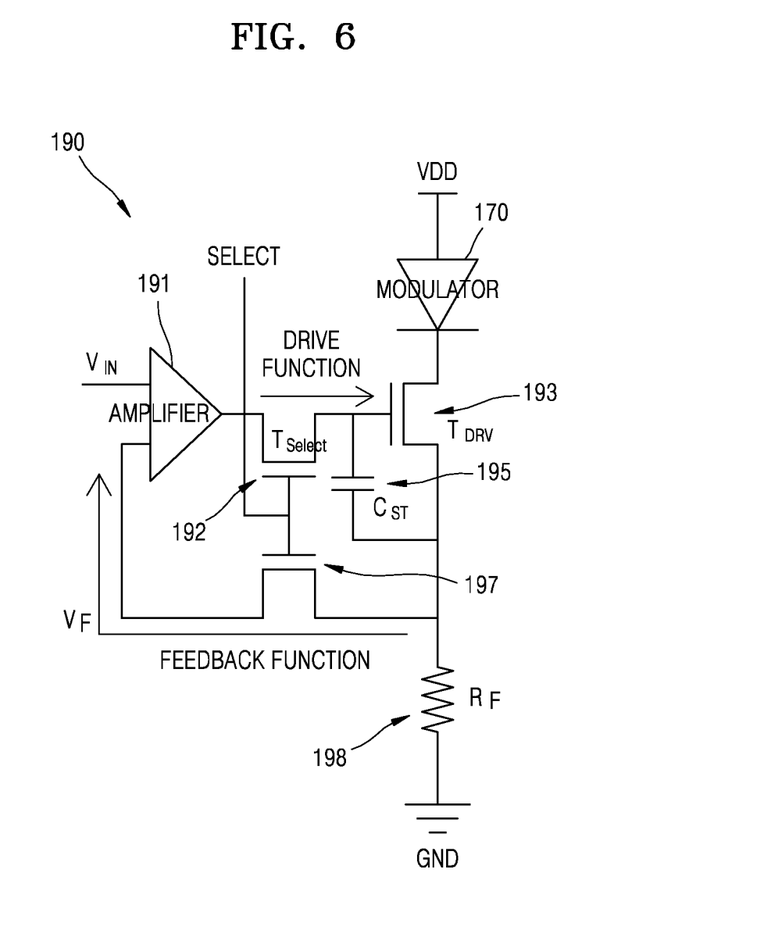
FIG. 6 illustrates an example of the driving circuit applied to the beam steering device, according to an exemplary embodiment.
Figure 7:
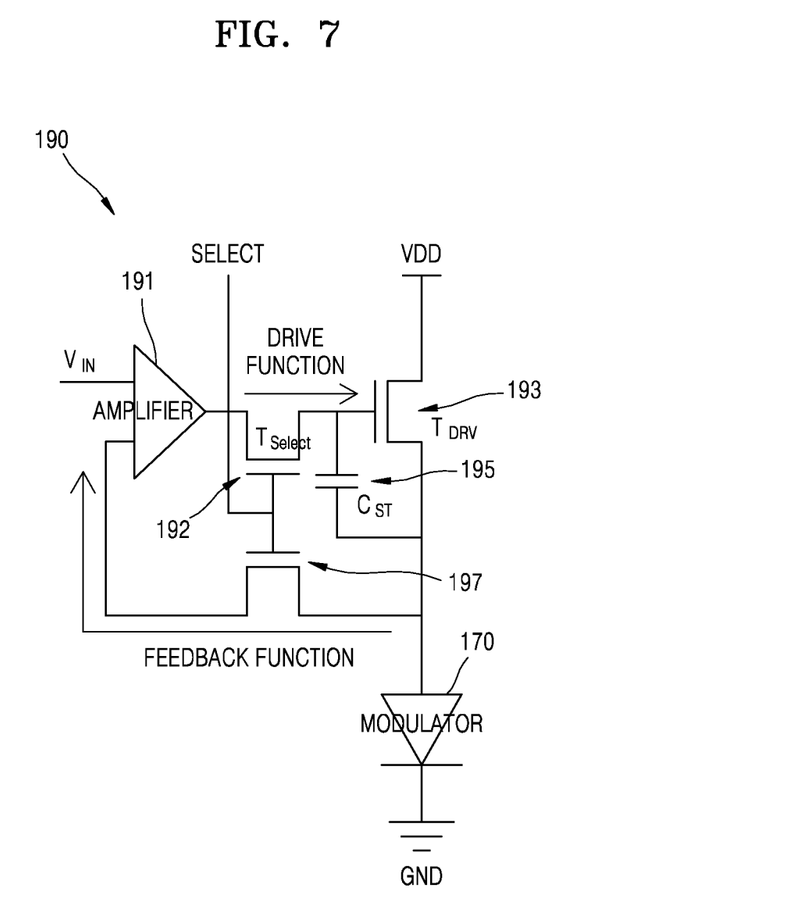
FIG. 7 illustrates another example of the driving circuit applied to the beam steering device, according to an exemplary embodiment.

FIG. 6 illustrates an example of the driving circuit 190 applied to the beam steering device 100, according to an exemplary embodiment. FIG. 7 illustrates another example of the driving circuit 190 applied to the beam steering device 100, according to an exemplary embodiment.

Referring to FIGS. 6 and 7, the driver 193 may include a driving transistor $T_{DRV}$, and the selector 192 may include a select transistor $T_{select}$. The voltage holder 195 may include a storage capacitor $C_{ST}$.

As shown in FIG. 6, the modulator 170 may be electrically connected to a source end of the driving transistor $T_{DRV}$, wherein a resistor $R_F$ 198 may be further included at a drain end of the driving transistor $T_{DRV}$.

When the select transistor $T_{select}$ of the selector 192 is turned on by a select signal, an input voltage $V_{IN}$ input through an input amplifier 191 is applied to a gate of the driving transistor $T_{DRV}$ of the driver 193. In this case, a voltage applied to the modulator 170 is VDD−VDS_$T_{DRV}$−$V_F$, where VDS_$T_{DRV}$ denotes a source-drain voltage of the driving transistor $T_{DRV}$, and $V_F$ denotes a voltage applied to the resistor $R_F$ 198. As described above, a voltage applied to the modulator 170 may be determined by the input voltage $V_{IN}$.

The storage capacitor $C_{ST}$ of the voltage holder 195 functions to maintain the input voltage $V_{IN}$ for a predetermined frame, e.g., one frame. When the performance of the modulator 170 deteriorates over time, by the use of the feedback unit 197, a total current decreases, causing a decrease in the voltage $V_F$, an increase in an output voltage of the input amplifier 191, a decrease in a voltage applied to the driving transistor $T_{DRV}$, an increase of a voltage applied to the modulator 170, and an increase in a reduced current.

As another example, as shown in FIG. 7, the modulator 170 may be electrically connected to a drain end of the driving transistor $T_{DRV}$. In this case, the resistor $R_F$ 198 of FIG. 6 may be omitted. Herein, a voltage applied to the modulator 170 is VDD−VDS_$T_{DRV}$.

Referring back to FIG. 5, the beam steering device 100 according to an exemplary embodiment may further include a data storage 180 configured to sequentially store data. In this case, the data storage 180 may include a sample & hold circuit.

When the data storage 180 is included, all the cells of the beam steering device 100 may be simultaneously turned on by sequentially storing all the data in the data storage 180 and then turning the selector 192 on.

Figure 8:
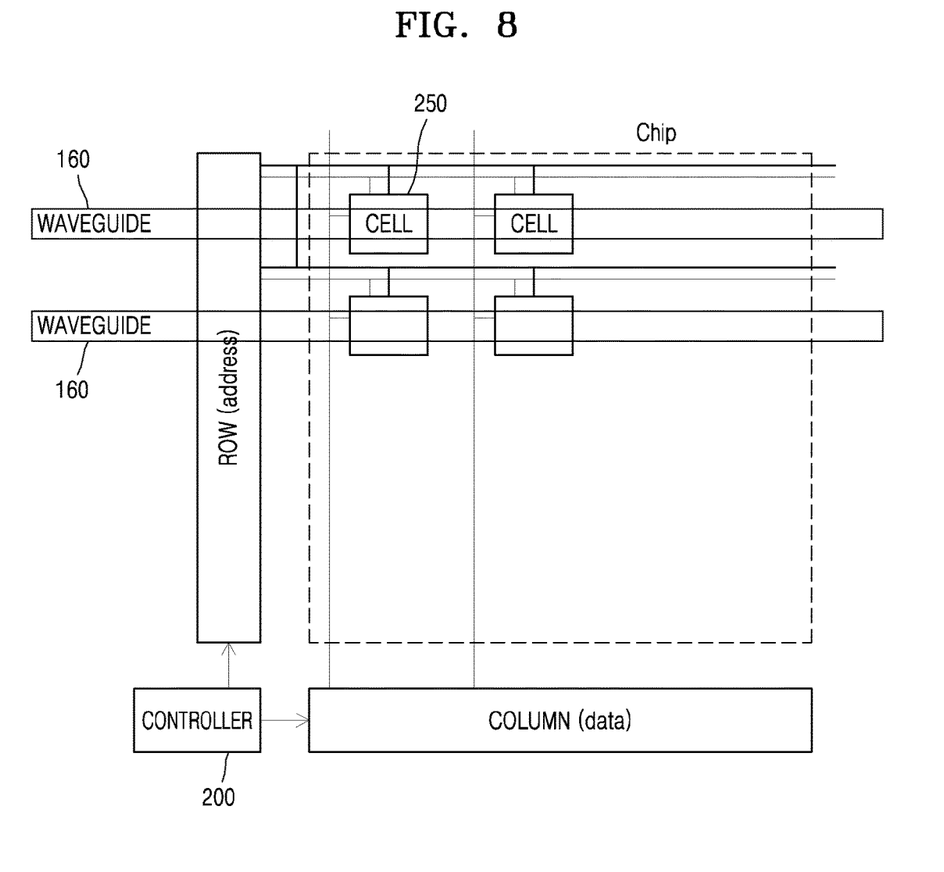
FIG. 8 illustrates an overall circuit configuration of a beam steering device chip, according to an exemplary embodiment.
Figure 9:
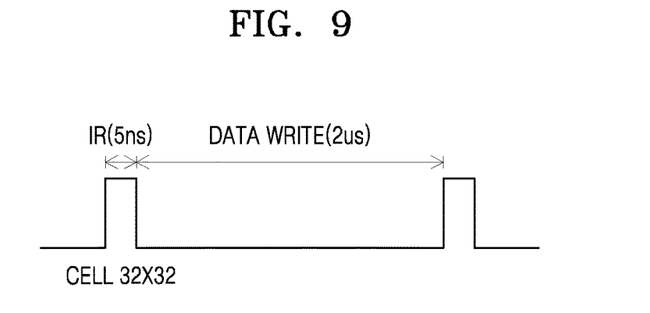
FIG. 9 illustrates a data voltage sequentially input to each cell of the beam steering device chip, according to an exemplary embodiment.

FIG. 8 illustrates an overall circuit configuration of a beam steering device chip, according to an exemplary embodiment. FIG. 9 illustrates a data voltage sequentially input to each cell of the beam steering device chip, according to an exemplary embodiment.

Referring to FIG. 8, the beam steering device chip achieves a two-dimensional array of cells by the plurality of modulators 170 arranged on each waveguide 160 forming a channel 150.

As shown in FIG. 9, when a data voltage is stored in all the cells of the beam steering device chip, then a beam is transmitted through the waveguides 160, and a phase is changed to steer the beam in a desired direction, for a next frame, a beam may also be steered in a next intended direction by storing a data voltage in all the cells, then emitting the beam, and changing a phase.

When the cells of the beam steering device chip have, for example, an arrangement of 32×32, if a duration time of a data voltage is, for example, about 5 ns, a time taken to store the data voltage in all the cells of the beam steering device chip, e.g., a data write time, is about 2 µs. That is, to implement beam steering, a time of, for example, about 2 µs per frame may be required.

According to the beam steering device 100 according to the above-described exemplary embodiment, by arranging the plurality of modulators 170 on each waveguide 160 forming a channel 150, a modulation region on the channel may be divided into a plurality of modulation regions, and each modulation region may be independently and selectively driven by being one-to-one connected to the driving circuit 190 such as a CMOS driving circuit. Therefore, a decrease in the beam steering performance due to a fault in some modulation regions may be prevented.

Hereinafter, various exemplary embodiments of the modulator 170 applicable to the beam steering device 100 according to an exemplary embodiment will be described with reference to FIGS. 4 and 10 through 14.

In the beam steering device 100 according to an exemplary embodiment, the modulator 170 includes the carrier modulation region 171, and the first doping region 173 of the first conductive type and the second doping region 175 of the second conductive type, which are electrically connected to the one side and the other side of the carrier modulation region 171, respectively.

Figure 10:
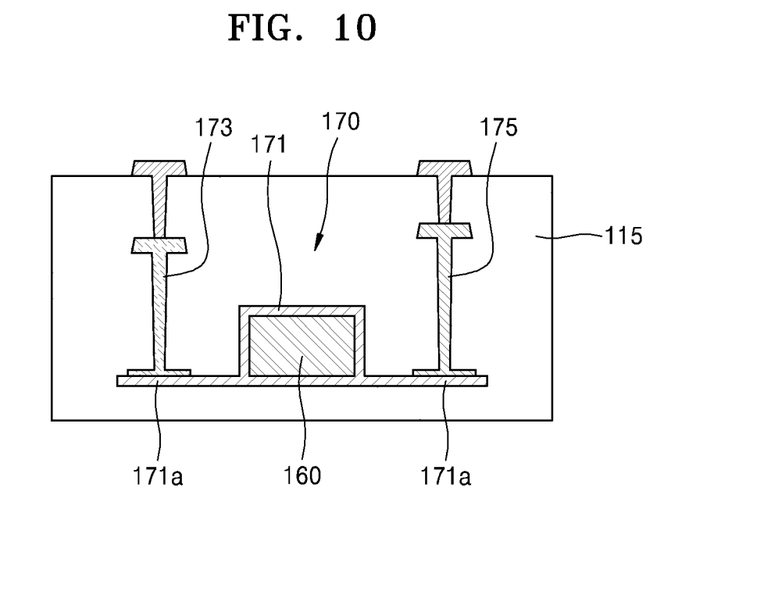
FIGS. 10, 11, 12, 13, and 14 illustrate modulators applicable to the beam steering device, according to various exemplary embodiments.
Figure 11:
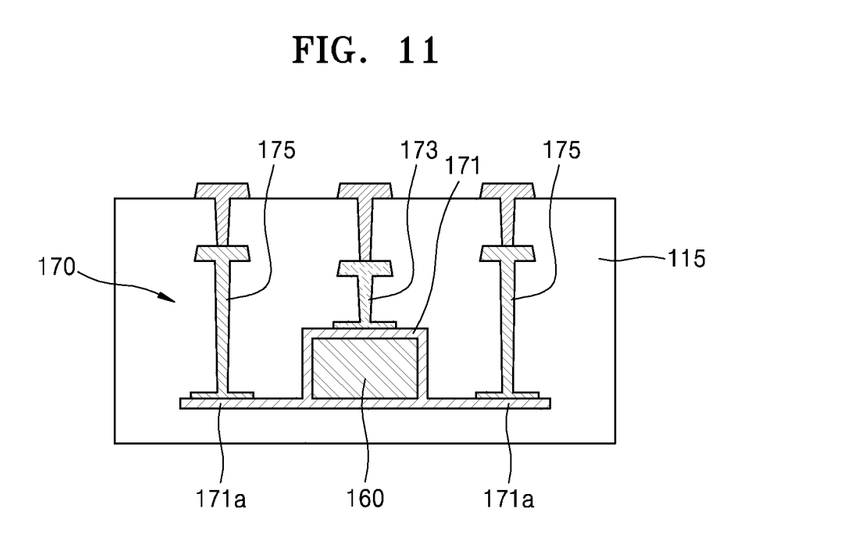

In this case, the carrier modulation region 171 may be formed to make a rib shape so as to surround a partial length of the waveguide 160 as shown in FIGS. 4, 10, and 11.

FIG. 4 shows a case in which the first doping region 173 is connected to a protruding upper end of the carrier modulation region 171 having a rib-shaped PIN or MOS structure, and the second doping region 175 is connected to a lower end of the carrier modulation region 171.

FIG. 10 shows a case in which the first doping region 173 is connected to one side of a wing part 171a of the carrier modulation region 171 having a rib-shaped PIN or MOS structure, and the second doping region 175 is connected to the other side of the wing part 171a of the carrier modulation region 171.

FIG. 11 shows a case in which the first doping region 173 is connected to a protruding upper end of the carrier modulation region 171 having a rib-shaped PIN or MOS structure, and the second doping region 175 is connected to both sides of the wing parts 171a of the carrier modulation region 171.

As shown in FIGS. 4, 10, and 11, when the carrier modulation region 171 is formed in a rib-shaped PIN or MOS structure so as to surround a partial length of the waveguide 160, there may be various methods of electrically connecting the first and second doping regions 173 and 175 to the carrier modulation region 171.

Figure 12:
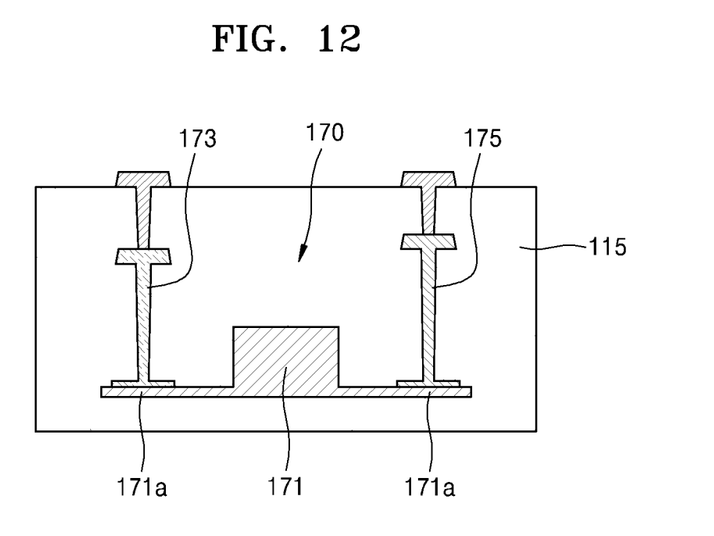
Figure 13:
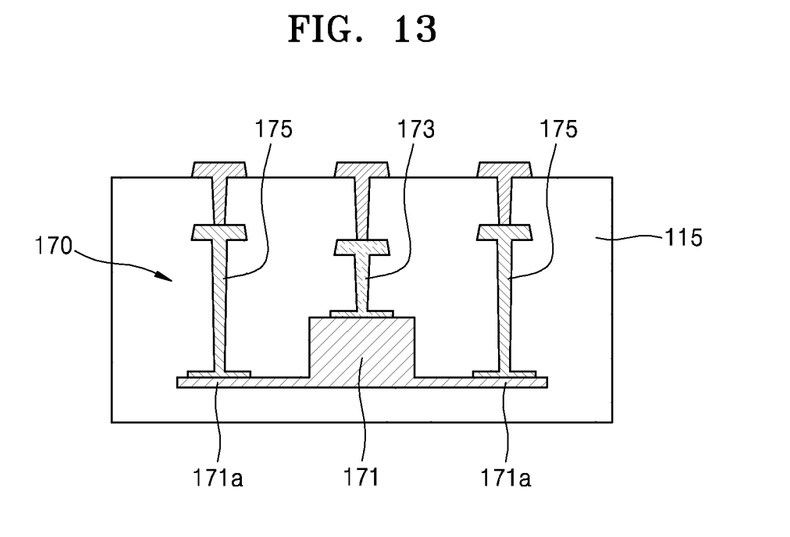

Although cases in which the carrier modulation region 171 is prepared to surround a partial length of the waveguide 160 have been described and shown with examples, according to the beam steering device 100 according to exemplary embodiments, the carrier modulation region 171 may be configured to act as the waveguide 160 as shown in FIGS. 12 and 13.

In this case, in a region of the channel 150, the carrier modulation region 171 may be intermittently formed along the waveguide 160 at only portions corresponding to the modulators 170. As another example, the carrier modulation region 171 may be continuously formed so as to act as the waveguide 160 in most of the region of the channel 150, and the first and second doping regions 173 and 175 may be formed only at a portion supposed to act as each modulator 170 and be one-to-one connected to the driving circuit 190.

As described above, even when the carrier modulation region 171 is prepared to act as the waveguide 160, the carrier modulation region 171 may be formed to have a rib-shaped PIN or MOS structure as shown in FIGS. 12 and 13.

FIG. 12 shows a case in which the first doping region 173 is connected to one side of the wing part 171a of the carrier modulation region 171 having a rib-shaped PIN or MOS structure and acting as the waveguide 160, and the second doping region 175 is connected to the other side of the wing part 171a of the carrier modulation region 171.

FIG. 13 shows a case in which the first doping region 173 is connected to a protruding upper end of the carrier modulation region 171 having a rib-shaped PIN or MOS structure and acting as the waveguide 160, and the second doping region 175 is connected to both sides of the wing parts 171a of the carrier modulation region 171.

Figure 14:
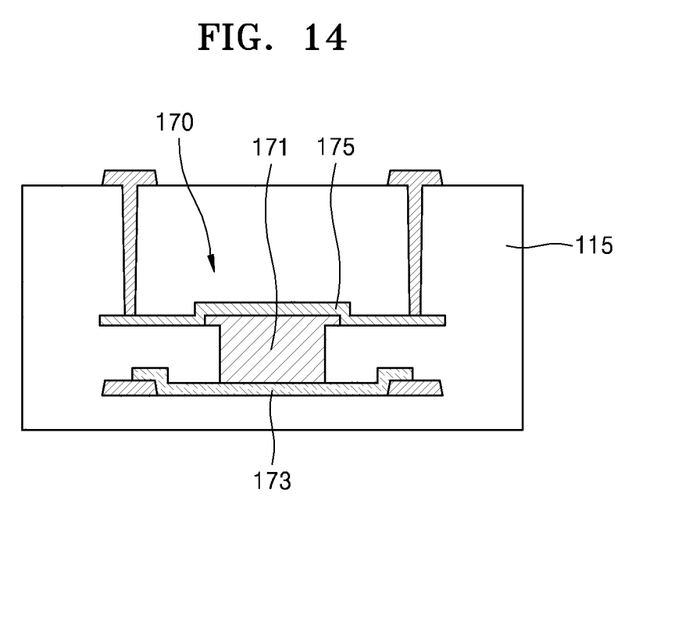

As shown in FIG. 14, the carrier modulation region 171 may be configured such that a cross-sectional shape of the outer periphery of the carrier modulation region 171 is approximately a quadrangular shape. FIG. 14 illustrates a case in which the carrier modulation region 171 is prepared to act as the waveguide 160, and as shown in FIGS. 4, 10, and 11, the carrier modulation region 171 may be configured such that a cross-sectional shape of the outer periphery of the carrier modulation region 171 is approximately a quadrangular shape while surrounding a partial length of the waveguide 160.

As shown in FIG. 14, when the carrier modulation region 171 is configured such that a cross-sectional shape of the outer periphery of the carrier modulation region 171 is approximately a quadrangular shape, the first doping region 173 may be formed, for example, on a lower end of the carrier modulation region 171 so as to be electrically connected to the carrier modulation region 171, and the second doping region 175 may be formed, for example, on an upper end of the carrier modulation region 171 so as to be electrically connected to the carrier modulation region 171. Alternatively, the first doping region 173 may be formed on the lower end of the carrier modulation region 171, and the second doping region 175 may be formed on the upper end of the carrier modulation region 171.

Figure 15:
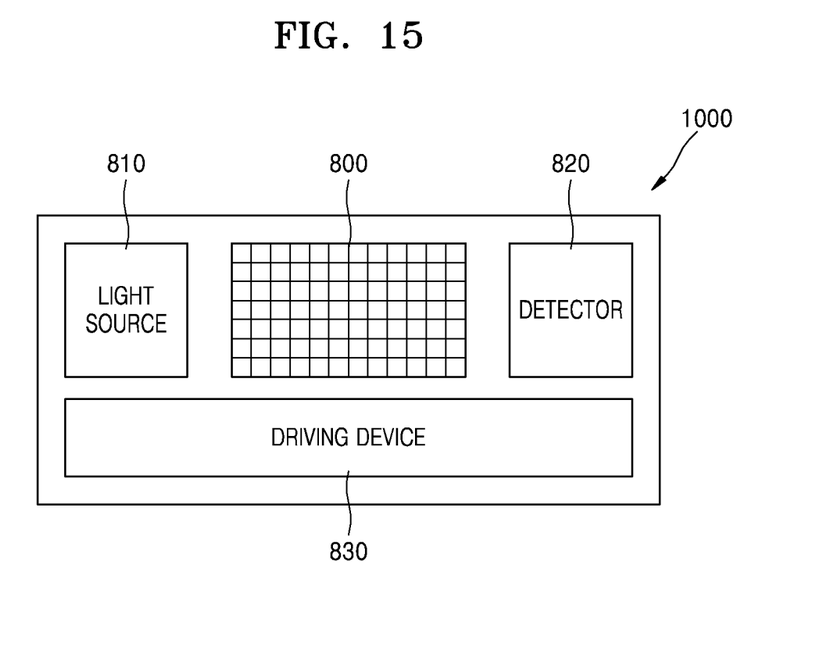
FIG. 15 illustrates a system employing the beam steering device, according to an exemplary embodiment.

FIG. 15 illustrates a system 1000 employing the beam steering device 100, according to an exemplary embodiment.

Referring to FIG. 15, the system 1000 according to an exemplary embodiment may include a light source 810 configured to emit a beam, a beam steering device 800 configured to steer the beam, a detector 820 configured to detect the steered beam, and a driving device 830. Herein, the driving device 830 may include a driving circuit configured to drive the light source 810, the beam steering device 800, and the detector 820.

As the light source 810, a laser light source such as a laser diode may be used. However, this is only illustrative, and various light sources may be used instead of a laser diode. A beam emitted from the light source 810 is input to the beam steering device 800. The beam steering device 800 steers the input beam to a desired location. The beam steering device 800 may include any of the beam steering device 100 according to the various exemplary embodiments described above, or any combination thereof. When the beam steered by the beam steering device 800, e.g., a laser beam, is irradiated on and reflected from an object, the detector 820 may detected the reflected beam. The system 1000 employing the beam steering device 800 may be applied to steer a beam in various fields, e.g., depth sensor, three-dimensional (3D) sensor, light detection and ranging (LiDAR), self-driving, and optical interconnect fields.

According to the beam steering device according to exemplary embodiments, by separately forming a plurality of modulators along each waveguide forming a channel and one-to-one connecting each modulator to a driving circuit to independently drive each modulator, even when a fault occurs in some modulators, a quality decrease of a steered beam may be prevented.

In addition, by arranging a desired number or more of modulators along each waveguide, even when a fault occurs in some modulators, a desired phase change amount may be obtained by using normally operating modulators except for the modulators in which a fault has occurred.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A beam steering device comprising:
a plurality of channels through which light is transmitted, wherein each of the plurality of channels comprises:
a waveguide, provided on a substrate, through which the light is transmitted; and
a plurality of modulators arranged along the waveguide, each of the plurality of modulators being configured to change, according to an electrical signal, a phase of light transmitted therethrough by changing a refractive index of a portion of the waveguide corresponding thereto; and
a driving circuit configured to provide the electrical signal to each of the plurality of modulators to thereby drive the plurality of modulators,
wherein each of the plurality of modulators comprises:
a carrier modulation region in which a carrier density varies with the electrical signal such that a change in a refractive index of light passing through the carrier modulation region changes a phase of the light;
a first doping region electrically connected to the carrier modulation region and doped to have a predetermined density, the first doping region being of a first conductive type; and
a second doping region that is electrically connected to the carrier modulation region and doped to have the predetermined density, the second doping region being of a second conductive type that is opposite the first conductive type,
wherein the carrier modulation region is an n-type or p-type oxide semiconductor doped to have a density lower than the predetermined density of the first and second doping regions, one of the first and second doping regions is a p-type oxide semiconductor, and the other one of the first and second doping regions is an n-type oxide semiconductor.

2. The beam steering device of claim 1, wherein the driving circuit comprises a plurality of driving circuits, each of the plurality of driving circuits being one-to-one connected to a corresponding one of the plurality of modulators so as to independently drive the corresponding modulator.

3. The beam steering device of claim 2, wherein the plurality of driving circuits are complementary metal oxide semiconductor (CMOS) circuits.

4. The beam steering device of claim 1, wherein, in each of the plurality of channels, the plurality of modulators are spaced apart from each other along the waveguide.

5. The beam steering device of claim 1, wherein
the first doping region is electrically connected to one side of the carrier modulation region; and
the second doping region is electrically connected to another side of the carrier modulation region opposite the one side.

6. The beam steering device of claim 5, wherein the carrier modulation region surrounds a portion of a corresponding waveguide.

7. The beam steering device of claim 6, wherein a refractive index of the carrier modulation region is lower than a refractive index of the corresponding waveguide.

8. The beam steering device of claim 7, wherein each of the plurality of modulators further comprises a cladding layer which covers the carrier modulation region and a portion of the corresponding waveguide which is not surrounded by the carrier modulation region.

9. The beam steering device of claim 5, wherein the carrier modulation region acts as a waveguide.

10. The beam steering device of claim 9, wherein each of the plurality of modulators further comprises a cladding layer having a refractive index which is lower than a refractive index of the carrier modulation region and surrounding the carrier modulation region.

11. The beam steering device of claim 1, wherein the waveguide comprises silicon.

12. The beam steering device of claim 1, wherein the carrier modulation region is an n-type or p-type oxide semiconductor in which a doping density is about $10^{17}$ or less, one of the first and second doping regions is a p-type oxide semiconductor with a doping density of about $10^{19}$ or greater, and the other one of the first and second regions is an n-type oxide semiconductor with a doping density of about $10^{19}$ or greater.

13. The beam steering device of claim 5, wherein an outer periphery of a cross-section of the carrier modulation region has an approximately rib shape or an approximately quadrangular shape.

14. The beam steering device of claim 5, wherein each of the plurality of modulators forms a p-type intrinsic n-type (PIN) diode or a metal oxide semiconductor (MOS) structure.

15. The beam steering device of claim 1, wherein the driving circuit comprises:
a driver configured to drive the plurality of modulators; and
a selector configured to perform a selection such that an input voltage is applied to the driver, to thereby apply a driving voltage to the plurality of modulators through the driver.

16. The beam steering device of claim 15, wherein each of the plurality of modulators, in combination with the corresponding portion of the waveguide corresponding thereto, forms a cell, and
the driving circuit further comprises a data storage configured to sequentially store data corresponding to each cell, and
the driving circuit is further configured to turn on the selector to simultaneously turn on all of the cells of the beam steering device according to the stored data.

17. The beam steering device of claim 15, wherein the driver comprises a driving transistor comprising a source end and a drain end,
the plurality of modulators are electrically connected to the source end of the driving transistor, and
the drain end of the driving transistor comprises a resistor.

18. The beam steering device of claim 15, wherein the driver comprises a driving transistor comprising a source end and a drain end, and
the plurality of modulators are electrically connected to the drain end of the driving transistor.

19. The beam steering device of claim 15, wherein the driving circuit further comprises at least one of a voltage holder configured to hold an applied voltage for a predetermined time and a feedback unit configured to perform a feedback so as to compensate for a performance decrease of the plurality of modulators.

20. A system comprising:
a light source configured to emit light;
a beam steering device configured to steer the light emitted by the light source towards an object; and
a detector configured to detect the steered light reflected from the object,
wherein the beam steering device comprises:
a plurality of channels through which light is transmitted, wherein each of the plurality of channels comprises:
a waveguide, provided on a substrate, through which the light is transmitted; and
a plurality of modulators arranged along the waveguide, each of the plurality of modulators being configured to change, according to an electrical signal, a phase of light transmitted therethrough by changing a refractive index of a portion of the waveguide corresponding thereto,
wherein each of the plurality of modulators comprises:
a carrier modulation region in which a carrier density varies with the electrical signal and is an n-type or p-type oxide semiconductor doped;
a first doping region electrically connected to the carrier modulation region and doped; and
a second doping region electrically connected to the carrier modulation region and doped; and
a driving circuit configured to provide the electrical signal to each of the plurality of modulators to thereby drive the plurality of modulators,
wherein the carrier modulation region is an n-type or p-type oxide semiconductor doped to have a density lower than a predetermined density of the first and second doping regions, one of the first and second doping regions is a p-type oxide semiconductor, and the other one of the first and second doping regions is an n-type oxide semiconductor.

* * * * *